United States Patent [19]

Kosugi et al.

[11] Patent Number: 4,775,877

[45] Date of Patent: Oct. 4, 1988

[54] METHOD AND APPARATUS FOR PROCESSING A PLATE-LIKE WORKPIECE

[75] Inventors: Masao Kosugi, Yokohama; Yukio Tokuda, Kawasaki, both of Japan

[73] Assignee: Canon Kabushiki Kaisha, Tokyo, Japan

[21] Appl. No.: 923,899

[22] Filed: Oct. 28, 1986

[30] Foreign Application Priority Data

| Oct. 29, 1985 | [JP] | Japan | 60-240452 |
| Oct. 29, 1985 | [JP] | Japan | 60-240453 |
| Oct. 29, 1985 | [JP] | Japan | 60-240454 |

[51] Int. Cl.⁴ .......................................... G03B 27/42
[52] U.S. Cl. ....................................... 355/53; 355/77
[58] Field of Search ............................ 355/53, 73, 77

[56] References Cited

U.S. PATENT DOCUMENTS

| 3,566,763 | 3/1971 | Knopf | 355/53 |
| 3,597,078 | 8/1971 | Miyauchi | 355/73 |
| 4,530,587 | 7/1985 | Kosugi et al. | 355/53 |
| 4,577,957 | 3/1986 | Phillips | 355/53 X |
| 4,583,847 | 4/1986 | Battig et al. | 355/53 |

Primary Examiner—Donald A. Griffin
Attorney, Agent, or Firm—Fitzpatrick, Cella, Harper & Scinto

[57] ABSTRACT

A step-and-repeat type exposure apparatus includes an X-Y stage for moving stepwise a workpiece such as a wafer relative to a projection lens system so that images of a pattern of an original such as a reticle are transferred onto different areas on the wafer in sequence. After exposures of such areas of the wafer that are included in one of plural regions of the wafer, the position of the wafer relative to the X-Y stage is shifted. Then, exposures of the areas included in another region of the wafer are effected. In another aspect, the step-and-repeat exposures of the wafer are effected along a direction inclined to the moving directions of the X-Y stage.

23 Claims, 10 Drawing Sheets

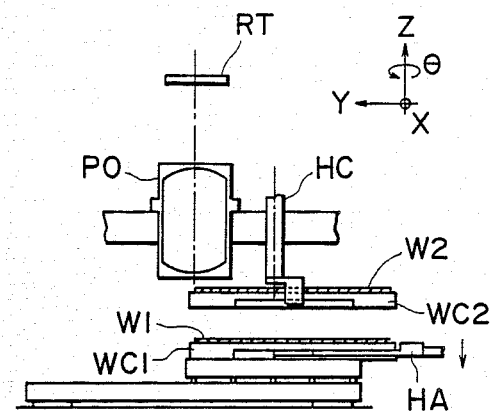
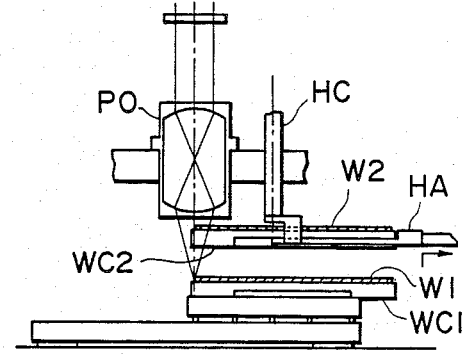
FIG. 5A                    FIG. 5B
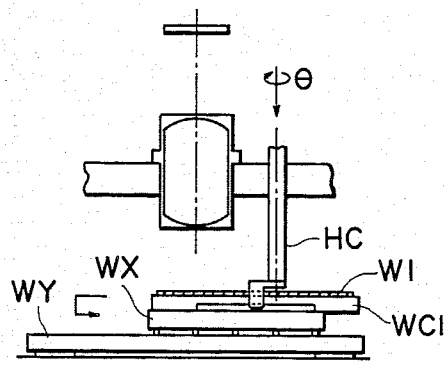
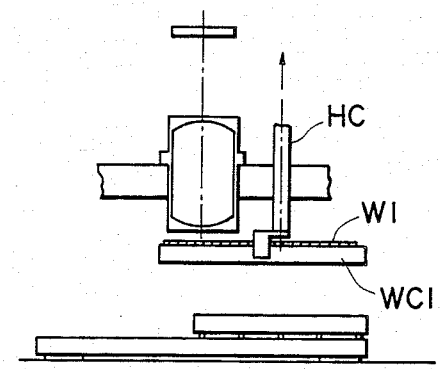
FIG. 5C                    FIG. 5D

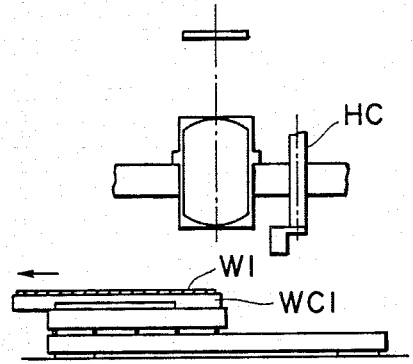
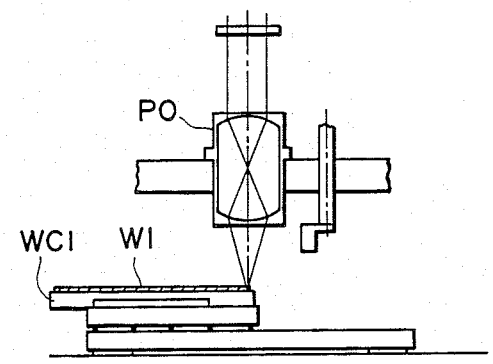
FIG. 5E          FIG. 5F
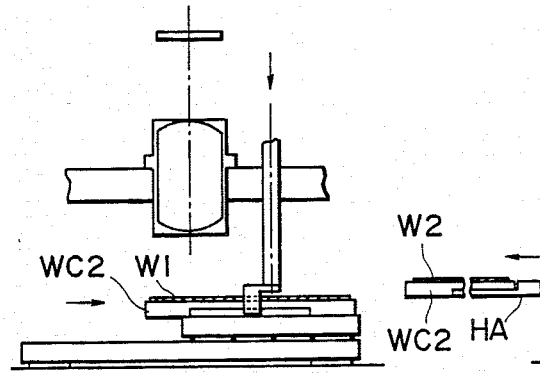
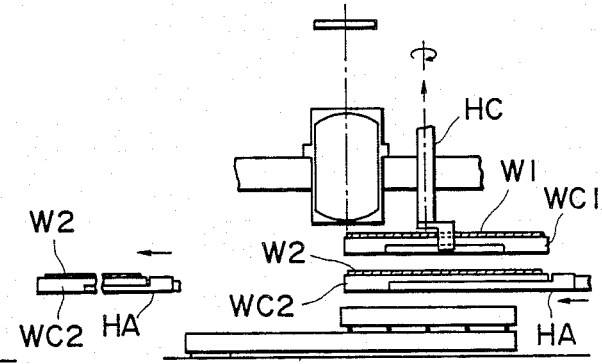
FIG. 5G          FIG. 5H

METHOD AND APPARATUS FOR PROCESSING A PLATE-LIKE WORKPIECE

FIELD OF THE INVENTION AND RELATED ART

This invention relates to a method of processing a plate-like workpiece, which is suitably applicable, e.g., to the manufacture of semiconductor devices such as integrated circuits. In another aspect, the invention is concerned with a method of exposing a large-size or large-diameter workpiece, utilizing the principle of the workpiece processing method. In a further aspect, the invention is concerned with an exposure apparatus suitably usable with large-diameter workpieces as well as small-size or small-diameter workpieces.

In the field of manufacture of semiconductor devices, exposure apparatuses of step-and-repeat type (called "steppers") are used in photolithographic processes. In these steppers, a workpiece such as, e.g., a semiconductor wafer is placed under a projection lens and is moved stepwise. During the stepwise movement, images of a pattern of an original or a reticle are projected in a reduced scale onto different portions of the wafer in a predetermined sequence.

Currently available wafers have various sizes or diameters so as to meet manufacture of various types of semiconductor devices currently developed. That is, for the devices such as MOS memories that have a small variety and thus are suitable for mass production run, it is desirable to use large-diameter wafers in order that an increased number of devices are obtained from each wafer in the batch process. As for such wafers, 6-inch ($\phi$=150 mm) wafers are prevalently used. And, it is expected that 8-inch ($\phi$=200 to 10-inch ($\phi$=250 mm) wafers will be are used in the near future.

On the other hand, for the devices such as gate arrays or the like that have a large variety and thus are suitable for short production run, 3-inch to 4-inch wafers are currently used. Particularly, for the manufacture of light-emitting devices or FET (Field-Effect-Transistor) having substrates of GaAs, the maximum wafer diameter is 3-inch at the best due to the difficulty in the crystal technology.

In view of the situations above, it is desirable to develop an exposure apparatus capable of processing wafers of 8-inch to 10-inch diameters and, nevertheless, is capable of processing small-diameter wafers very suitably without any particular disadvantages as compared with conventional exposure apparatuses designed exclusively for use with the small-diameter wafers.

Exposure apparatuses capable of processing large-diameter wafers may be realized simply by increasing the size of the conventional exposure apparatuses. By doing so, however, the following disadvantages will occur:

(1) An X-Y stage of the exposure apparatus should have a movable stroke which is three or four times larger than the size or diameter of the wafer to be processed. Thus, the increase in the movable stroke inevitably increases the size of the movable-stage mechanism including the X-Y stage.

(2) It follows from the above that accuracies the same as those in the small-size stage mechanism is difficult to assure. Also, to achieve the same accuracy, the rigidity or stiffness of guide members and the like must be increased.

(3) As a result, a heavier stage must be used.

(4) As the measures against vibration due to the heavier weight of the stage and to the acceleration upon movement of the stage, the structure of the lens holding means or the like must be strengthened.

(5) Because of decreases in a rising speed and a falling speed due to the increase in the moving mass, or because of an increase in the positioning time due to the multiplied vibration, a prolonged time is required for the displacement and positioning of the stage.

(6) The manufacturing cost of the X-Y stage, the dimensions of the apparatus as a whole and the manufacturing cost of the apparatus as a whole increase unacceptably.

It is seen therefrom that, when such bulky exposure apparatus capable of processing 8-inch to 10-inch diameter wafers is used to process small-diameter wafers such as 3-inch to 4-inch or 5-inch wafers, the following disadvantages will result:

(a) The apparatus is too bulky (items 1, 3 and 4).
(b) The apparatus is too expensive (items 2 and 6).
(c) The throughput is low (item 5).

From the foregoing, it is seen that merely increasing the size of the exposure apparatus to meet large-diameter wafers is of great disadvantage for users.

It is therefore desirable to develop an exposure apparatus which meets a large variety of wafer diameters and which is free from the above-described disadvantages when it is used to process small-size wafers. It is also desirable to develop a method of processing workpieces such as wafers, which method is very suitable to handle large-diameter wafers.

What is desirable as the wafer handling method is that:

(1) It allows reduction in the time necessary for exchanging wafers and thus improves the throughput.

(2) It allows transfer of wafers between a wafer chuck and a wafer hand in a manner suitable for correcting errors in flatness of the wafer.

(3) It requires a minimum length of transportation path for the wafers, thus allowing reduction in size of the apparatus. Also, it does not restrict the orientation of the wafer when it is to be placed on the X-Y stage.

(4) It allows easy retry.

SUMMARY OF THE INVENTION

It is accordingly a primary object of the present invention to provide a method and an apparatus for suitably processing large-size or large-diameter workpieces such as wafers.

It is another object of the present invention to provide a method and apparatus for processing both large-size or large-diameter workpieces and small-size or small-diameter workpieces, without causing disadvantages described hereinbefore.

It is a further object of the present invention to provide a semiconductor device manufacturing exposure apparatus which is capable of processing a large variety of wafer diameters, without causing disadvantages such as described hereinbefore.

It is a still further object of the present invention to provide a semiconductor device manufacturing method which is suitable for processing large-size or large-diameter wafers.

Briefly, according to one aspect of the present invention, to achieve these objects, the positional relation between a workpiece and a stage device carrying thereon the workpiece is changed in the course of the processing of the workpiece. In a preferred embodiment of the present invention which will be described later, the area of the workpiece is divided into two and, during a first half of the processing operation, one of the halves of the workpiece is processed and, after changing the positional relation between the workpiece and the stage, the other half of the workpiece is processed. With such arrangement, the movable stroke of the stage is reduced significantly, with the result that the apparatus can be made compact.

In accordance with another feature of the present invention, to achieve the above objects, a hand is provided which is arranged to temporarily hold a workpiece, placed on a stage and having been processed, at the time of exchange thereof by new workpiece. This allows that a wafer supplying/collecting hand, which is single, supplies a new workpiece onto the stage and collects the processed workpiece which is temporarily held by the temporarily holding hand. With such arrangement, the necessity of providing a separate workpiece collecting hand is avoided, with the result that the apparatus can be made compact.

In accordance with a third feature of the present invention, to achieve the above objects, a workpiece carrying stage movable in two orthogonal directions is operated to displace the workpiece, carried thereon, in a direction that is inclined to the two orthogonal directions along which the stage is movable. For this purpose, the stage is driven in the two orthogonal directions at the same time. Therefore, the displacing speed of the workpiece corresponds to a resultant speed of combined movements in the two orthogonal directions. As a result of this, the time necessary for processing the workpiece can be reduced significantly and, therefore, the throughput of the apparatus is improved.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 5A-5H are schematic views, respectively, showing the manner of processing a semiconductor wafer, in accordance with another embodiment of the present invention.

DESCRIPTION OF THE PREFERRED EMBODIMENTS

Figure 1:
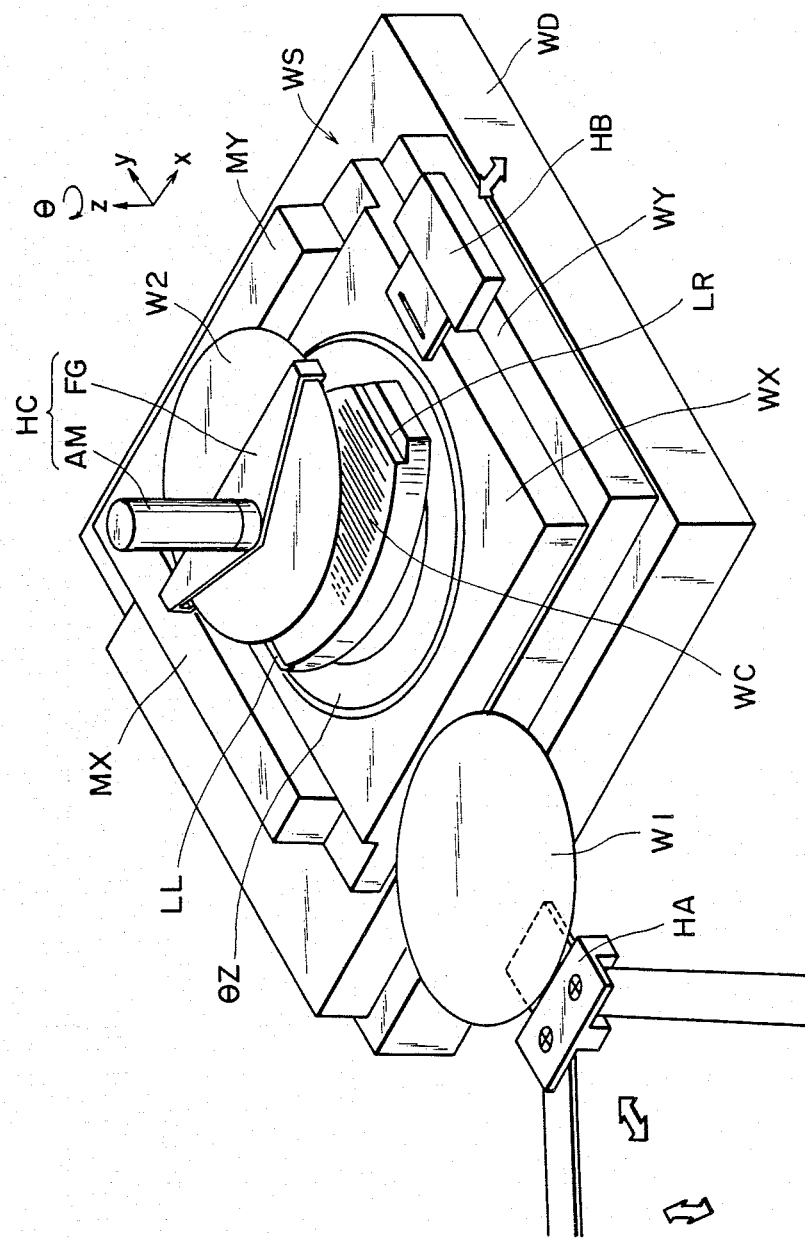
FIG. 1 is a schematic view of a major portion of a semiconductor device manufacturing exposure apparatus according to one embodiment of the present invention.
Figure 9:
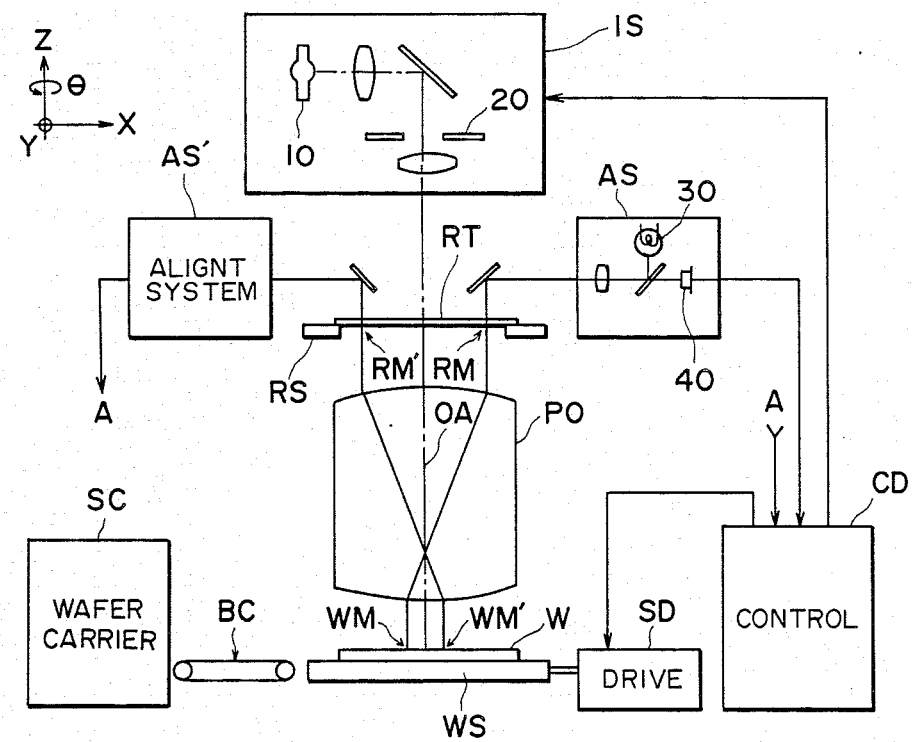
FIG. 9 is a schematic and diagrammatic view showing a general arrangement of the exposure apparatus of FIG. 1.

Referring first to FIG. 1, there is shown a semiconductor device manufacturing exposure apparatus of step-and-repeat type (called "stepper", according to one embodiment of the present invention. More particularly, FIG. 1 shows general arrangements of a wafer stage and components adjacent thereto, which are at a wafer transfer station. While not shown in FIG. 1, the exposure apparatus includes an illumination system, a reticle stage, a projection lens system, a TTL (through-the-lens) alignment optical system and so on. These components are illustrated in FIG. 9. As illustrated in FIG. 9, the projection lens system denoted at PO is disposed so that its optical axis OA is parallel to an axis Z of X-Y-Z coordinates. A reticle RT is held in an object plane of the projection lens system PO by a reticle stage RS. A workpiece which is a semiconductor wafer, in this embodiment, is denoted by a character W. The wafer W is held in an image plane of the projection lens system PO by a wafer stage WS. An illumination system IS is arranged to produce light of a predetermined wavelength, e.g. g-line or i-line, to irradiate the reticle RT with the same so as to transfer an image of a pattern, provided on the reticle RT, onto the wafer W by means of the projection lens system PO. The illumination system IS includes, in this example, a super-high-pressure Hg lamp 10, a masking blade 20 effective to determine the range of illumination on the reticle RT, and so on. An alignment system AS comprises a light source 30, a photodetector 40, etc. for photoelectrically detecting alignment marks RM and WM provided on the reticle RT and the wafer W, respectively, by way of the projection lens system PO. Also, another alignment system AS' is provided so as to photoelectrically detect alignment marks RM' and WM' on the reticle RT and the wafer W. Control unit CD is provided to control the exposure apparatus as a whole. Typically, it controls the exposure operation using the illumination system IS and sequential stepwise movements of the wafer stage WS by use of a stage driving system SD, so that they are executed alternately, i.e. in the step-and-repeat manner. Also, in accordance with output signals from the alignment systems AS and AS', the control unit CD discriminates relative positional deviation between the reticle RT and the wafer W with respect to each of the directions of X, Y and θ (rotational). The detected positional deviation is corrected by displacing at least one of the reticle stage RS and the wafer stage WS in appropriate directions by a necessary amount, in accordance with the detected positional deviation. The displacement of the wafer stage WS at this time is executed by the driving system SD. On the other hand, the displacement of the reticle RT is achieved by a reticle stage driving system, not shown. A wafer conveying system BC is operable to transfer wafers from a wafer carrier SC to the wafer stage with the aid of a wafer handling mechanism, not shown in FIG. 9.

Referring back to FIG. 1, a base WD carries thereon the wafer stage WS which comprises a stage WY movable in the Y direction, a stage WX movable in the X direction and a stage $\theta Z$ movable in the $\theta$ direction (rotational direction) and the Z direction (vertical). The stage WY and the WX cooperate with each other to constitute an X-Y stage. In addition to the wafer stage WS, other components of the exposure apparatus such as the projection lens system PO are carried on or fixedly secured to the base WD.

The apparatus further includes a laser interferometer measuring system having an optical square denoted at MX and MY in FIG. 1, a hand HA operable to supply/collect wafers to and from the wafer stage, a hand HB exclusively provided so as to collect wafers of small diameters, a hand HC provided to shift the wafer as will be described later, and a wafer chuck WC disposed on the stage $\theta Z$. As shown in FIG. 1, the wafer chuck WC is formed with recesses LL and LR, provided at opposite ends thereof, so as to allow introduction of the hand HB to the back side of the wafer being carried on the wafer chuck WC. The hand HC comprises a finger portion FG for picking up the wafer, carried on the wafer chuck WC, and an arm AM for moving upwardly/downwardly and rotating the finger portion FG. The center of rotation of the arm AM is eccentric with respect to the center of the wafer to be picked up from the wafer chuck WC.

Figure 2A:
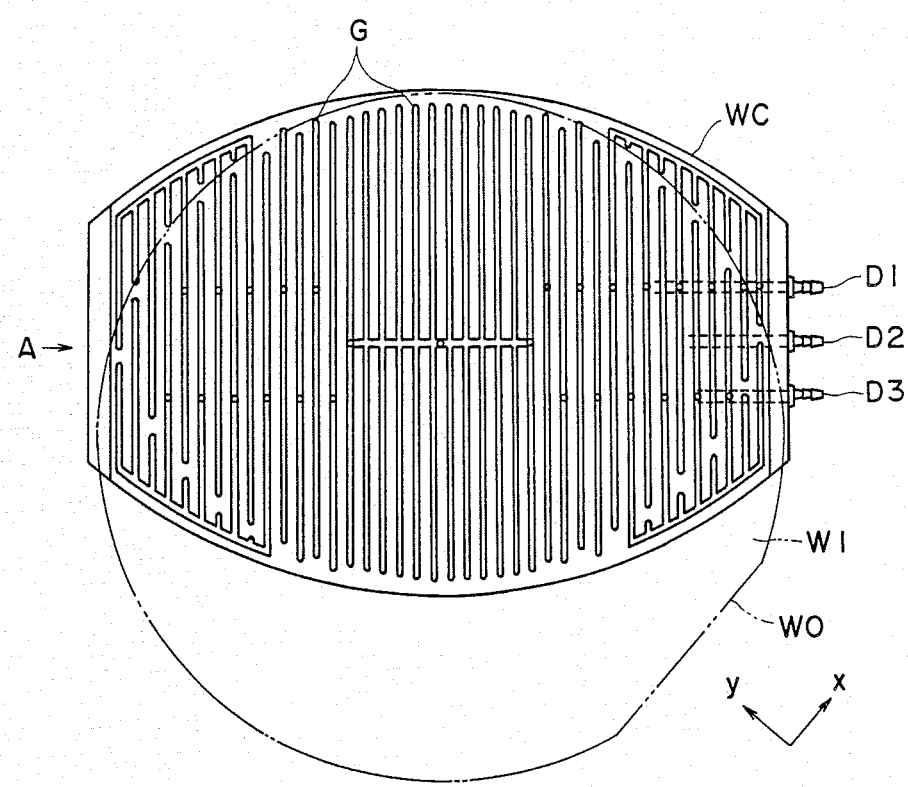
FIG. 2A is a plan view of a wafer chuck included in the apparatus of FIG. 1.
Figure 2B:
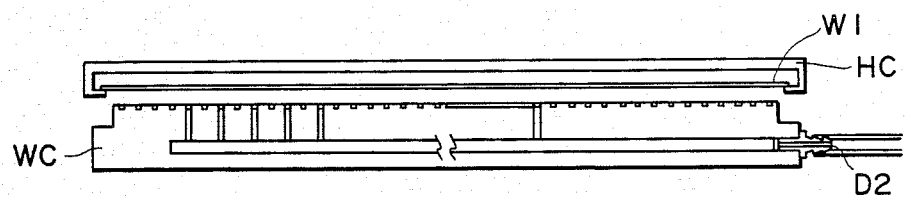
FIG. 2B is a sectional view of the wafer chuck, taken on line A—A in FIG. 2A.

FIG. 2A is a top plan view of the wafer chuck WC, while FIG. 2B is a sectional view thereof taken on line A—A in FIG. 2A. As illustrated, the wafer chuck WC has an upper surface in which a number of vacuum-suction grooves G, extending rectilinearly, are provided. These grooves G are formed into suitable groups which are in communication with respective vacuum sources, not shown, by way of a suitable number of nipples such as at D1, D2 and D3. The grouping of the grooves G is made so as to meet variation in size of the wafers to be carried on this wafer chuck WC and also so as to assure that all the vacuum-suction grooves in one group communicated with the nipple D1 or D3 and all the vacuum-suction grooves in the group communicated with the nipple D2 are always covered by a wafer which is placed on the wafer chuck before and after its positional relation with the wafer chuck is shifted, as will be described later. The pattern defined by these vacuum-suction grooves G may be changed in any way so as to meet the size of the wafer to be carried on the wafer chuck WC and to meet the state of the wafer after its positional relation with the wafer chuck is changed, provided that the wafer can always be held by the wafer chuck satisfactorily and that, when held by the wafer chuck, satisfactory flatness of the wafer is retained. While, in this embodiment, the wafer chuck WC is arranged to hold the wafer along lines, the wafer chuck may be of pin-chuck structure adapted to support the wafer at points. Also, a number of vacuum-suction holes may be provided in place of the vacuum-suction grooves, so that the wafer is held by area support.

The exposure operation using such wafer chuck as described will now be described, taken in conjunction with FIGS. 3A–3H and 4A–4C.

Figure 4A:
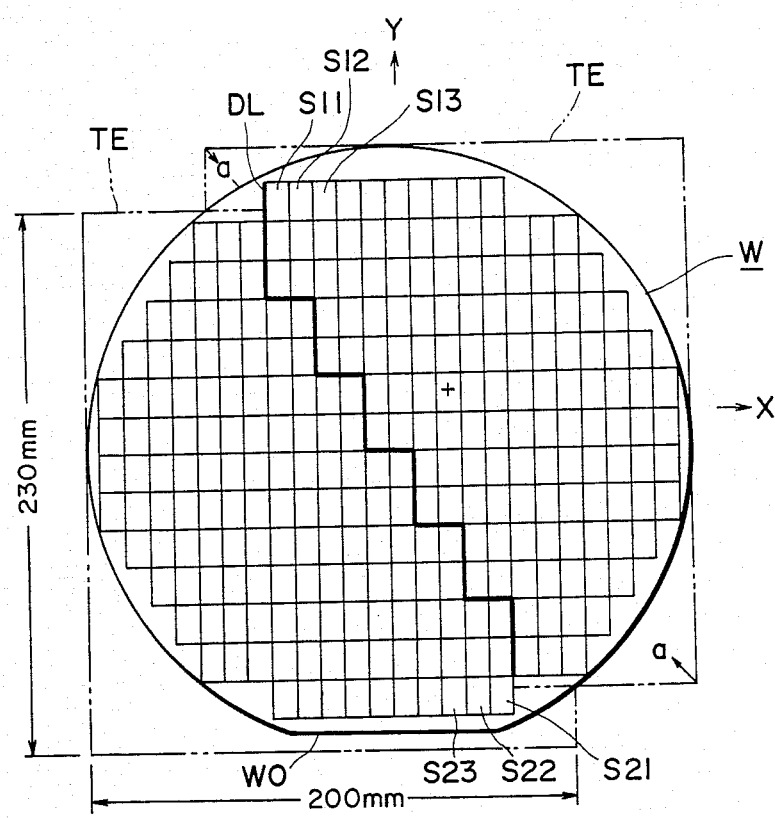
FIG. 4A is a schematic view showing an example of layout of chips or shot areas on a semiconductor wafer which is to be processed by the apparatus of FIG. 1.
Figure 4B:
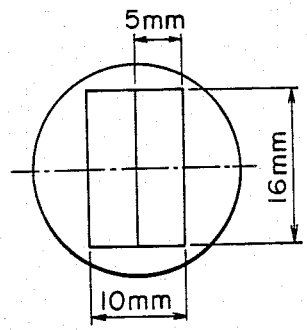
FIG. 4B is a schematic view showing an example of layout of actual element patterns formed on a reticle and included in an effective exposure region.

As shown in FIG. 4A, the X-Y stage of the present embodiment has a movable range TE which is 200 mm×230 mm, i.e. the movable distance of the stage WY is 230 mm and the movable distance of the stage WX is 200 mm. Such movable range of the X-Y stage is substantially the same as that in an exposure apparatus designed exclusively for use with 3-inch wafers. The projection lens system PO used in this embodiment has an effective picture field of $\phi 20$ mm. Where an actual element pattern of a size 5 mm×16 mm is going to be transferred onto different areas on a 10-inch wafer such as at W in FIG. 4A, the reticle RT is formed with two actual element patterns because the effective picture field of the projection lens system PO is $\phi 20$ mm. Thus, per one exposure, two actual element patterns (10 mm×16 mm) are photoprinted on the wafer W, thus improving the throughput.

If, in such case, the wafer W is processed in accordance with conventional methods, it is not possible to print images of the reticle RT pattern onto the whole surface of the wafer W, no matter how the wafer W is placed on the X-Y stage. As compared therewith, this is achieved in accordance with this embodiment of the present invention. That is, according to the present embodiment, as illustrated in FIG. 4A, the surface region of the wafer W is divided into two which are included in or covered by the movable range of the X-Y stage. First, the photolithographic exposure process is executed to one of the halves of the surface region of the wafer W. Subsequently, the position of the wafer W with respect to the X-Y stage is changed and, thereafter, the photolithographic exposure process is executed to the other half of the surface region of the wafer W. It is seen from FIG. 4A that, where the surface region of one wafer is divided into two and the photolithographic exposure process is executed to the halves of the surface region while changing the positional relation between the wafer and the wafer chuck in the course of the exposure process, the maximum diameter of a wafer which can be processed is determined by a diagonal stroke of the rectangular movable range of the X-Y stage and by the size of each of the halves of the wafer defined by a dividing line DL.

For the exposure operation, the reticle RT and the like are initially set. When, after this, start of exposure operation is instructed, the exposure apparatus starts the following operations under the influence of the control made by a central processing unit such as the control unit CD shown in FIG. 9.

Figures 3A, 3B:
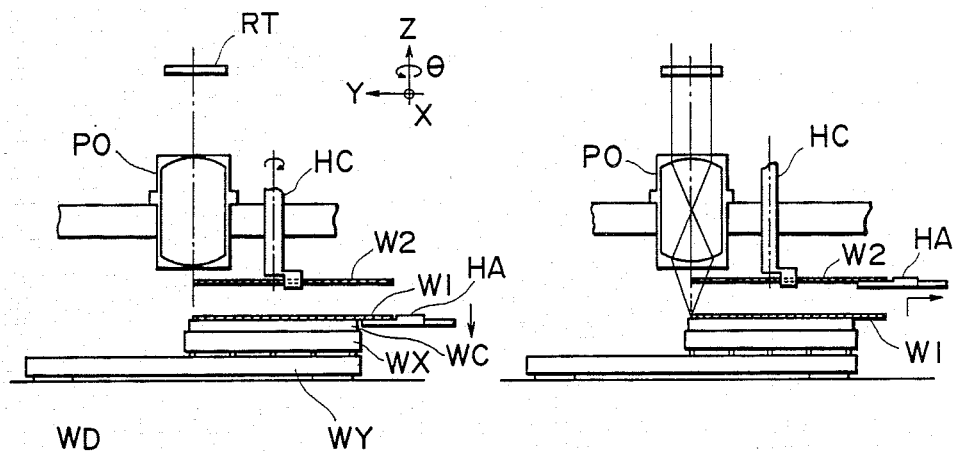
FIGS. 3A-3H are schematic views, respectively, illustrating operation of the components shown in FIG. 1.

First, a wafer such as at W1 (FIG. 3A) is taken out from a wafer carrier, not shown, and is placed on the chuck WC by the hand HA, such as shown in FIG. 3A, with the chuck WC being inclinedly set with respect to the moving directions of the X-Y stage so that the longitudinal direction of the chuck WC substantially coincides with or becomes substantially parallel to the diagonal direction a—a of the movable range of the X-Y stage shown in FIG. 4. The positional relation of the wafer W1 with the chuck WC is illustrated by a phantom line in FIG. 2A. That is, a first region which is on the right-hand side of the dividing line DL shown in FIG. 4A is placed on the chuck WC, such that this region is held by the chuck WC by vacuum suction. If, at this time, a wafer such as at W2 (FIG. 3A) is held by the hand HC, the hand HA receives the wafer W2, after placing the wafer W1 on the chuck WC, such as shown in FIG. 3B and, then, carries the wafer W2 to a wafer receiving carrier, not shown.

Subsequently, the X-Y stage is moved so as to bring a first shot area S11 (FIG. 4A) of the first region of the wafer W1 to a position underneath the projection lens system PO, and the alignment of the wafer W1 in respect to the first shot area S11 is executed. After this, the first shot area S11 is exposed to the pattern of the reticle RT. Subsequently, while stepwisely moving the X-Y stage, exposure of all the succeeding shot areas S12, S13, etc. of the first region on the right-hand side of the dividing line DL shown in FIG. 4 are effected in the step-and-repeat manner. During such exposure operation, the hand HC is rotated in the $\theta$ direction by an angle of 180 degrees so that it is brought into the position shown in FIG. 3C.

Figures 3C, 3D:
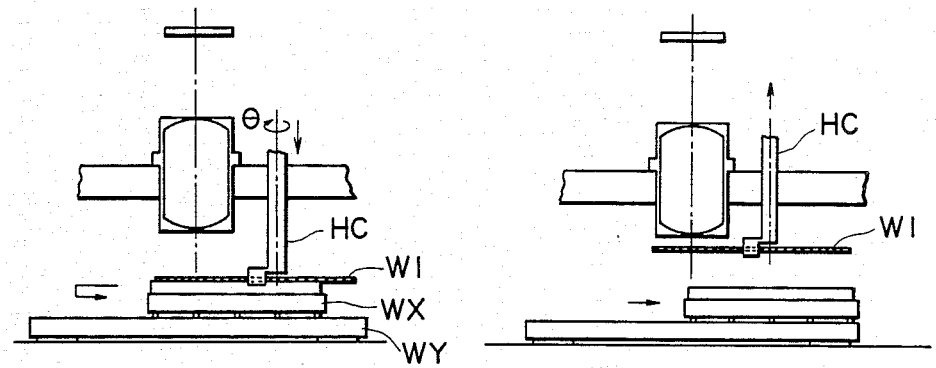
Figures 3E, 3F:
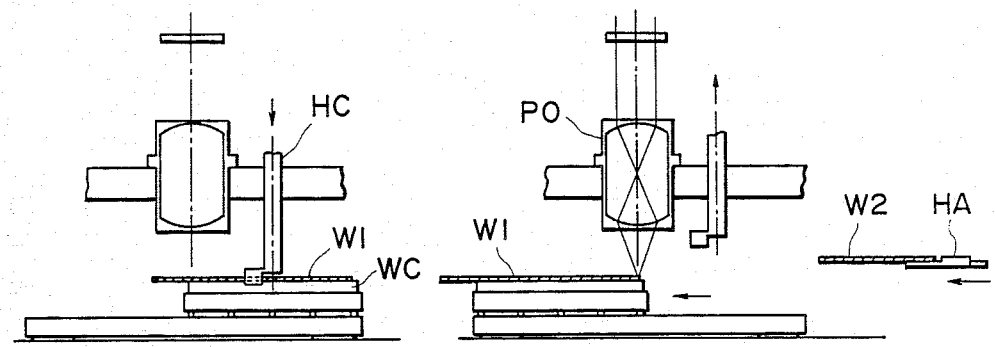

After completion of the exposure of the first region, the X-Y stage is moved to the wafer-transfer-station side (rightwardly as viewed in FIG. 3C). In the course of movement of the X-Y stage, the wafer W1 moving with the chuck WC is picked up by the hand HC (FIG. 3D), more particularly by the pawls of the finger portion FG of the hand HC. When the X-Y stage reaches the wafer transfer station, as illustrated in FIG. 1, the hand HC is moved downwardly so that the wafer W1 is again placed on the wafer chuck WC. At this time, the chuck WC is located under the second region of the wafer W1, i.e. the region on the lefthand side of the dividing line DL shown in FIG. 4, such that this region of the wafer W1 is held by the chuck WC by vacuum suction (FIG. 3E). While maintaining this state, the X-Y stage is moved so as to bring a first shot area S21 of the second region (FIG. 4A) to the position underneath the projection lens system PO. Then, the alignment in respect to the first shot area S21 is executed and, thereafter, exposure thereof is effected (FIG. 3F). Subsequently, while stepwisely moving the X-Y stage, exposure of all the succeeding shot areas S22, S23, etc. of the second region on the left-hand side of the dividing line DL shown in FIG. 4 is carried out in the step-and-repeat manner. During such exposure operation, a new wafer which is unexposed is supplied to the hand HA (FIG. 3F).

Figures 3G, 3H:
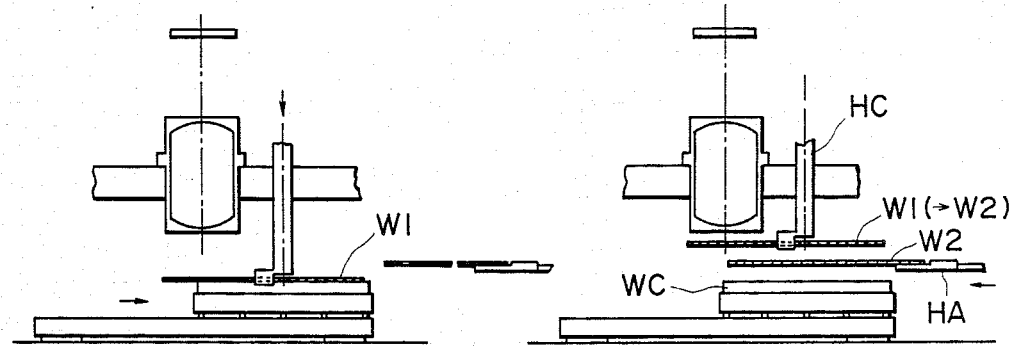

In the manner described above, the whole surface of the wafer is exposed to the images of the reticle RT pattern. When this is completed, the X-Y stage is moved to the wafer transfer station (FIG. 3G), whereat the exposed wafer W1 on the chuck WC is picked up by the hand HC (FIG. 3H). Then, the unexposed wafer W2 is brought onto the chuck WC from the hand HA (FIG. 3H). At the same time, the hand HC is rotated in the $\theta$ direction by an angle of 180 degrees. By this, the unexposed wafer assumes the position such as denoted at W1 in FIG. 3A and the exposed wafer assumes the position denoted at W2 in the same Figure.

At the time of unloading of the exposed wafer from the chuck WC by means of the hand HA, as described, the hand HC first picks up the exposed wafer from the chuck WC and then rotates by 180 degrees, presenting the exposed wafer to the hand HA side. This avoids the necessity that the hand HA accesses directly to the chuck WC and, therefore, removes the necessity of providing the chuck WC with an undesired recess for receiving the hand HA. As a result, the chuck WC has a wider supporting surface so that the wafer can be supported thereby more positively and stably. Also, there is no necessity of providing a specific wafer-collecting hand (particularly for large-diameter wafers). Thus, the structure can be retained compact.

Where wafers such as 5-inch wafers whose diameter is shorter than the widthwise size of the chuck WC are processed, each of these wafers are collected from the X-Y stage directly by the hand HB shown in FIG. 1. This avoids the necessity of cumbersome operations for changing the illustrated hand HC by another having a smaller size suitable for handling small-diameter wafers. Accordingly, for small-diameter wafers, the apparatus assures easy manipulation in the degree substantially the same as that in an exposure apparatus designed exclusively for use with small-diameter wafers.

In the apparatus according to the present embodiment, the position of the wafer relative to the wafer chuck is shifted in the course of the exposure process to the same wafer. This shift leads to a loss of time. It is to be noted however that, comparing an X-Y stage having a full stroke of 10 inches with an X-Y stage having a full stroke of 8 inches, the time necessary for moving stepwise through a distance is longer in the 10-inch stroke X-Y stage than in the 8-inch stroke X-Y stage. This is because of the differences in the mass and the like, as described hereinbefore. If the time for such step-movement with the 8-inch stroke X-Y stage is of an order of 0.4 sec., the time for the same step-movement with the 10-inch stroke X-Y stage will generally be of an order of 0.5 sec. Usually, a 10-inch wafer such as shown in FIG. 4A has shots of a number "250". Thus, the total time for the step-movements per one wafer (10-inch wafer) is 100 sec. in the case of 8-inch stroke X-Y stage; whereas it is 125 sec. in the case of 10-inch stroke XY stage. Thus, if the shift of wafer position in the present embodiment requires 10 sec., the total time necessary for completely processing one wafer with the present embodiment will be shorter by 15 sec. or more than that attainable with the 10-inch stroke X-Y stage.

In the present embodiment, as described, the direction of division by the dividing line DL defined for processing wafers whose diameter is not less than 230 mm, is inclined generally relative to the two orthogonal directions of the X and Y axes, more exactly it is inclined so that it becomes substantially parallel to the diagonal direction (a—a) with respect to the movable range of the X-Y stage. Also, the wafer chuck WC is disposed inclinedly, substantially in the same direction, relative to the X-Y axes, so as to meet the division of the wafer surface. If, however, it is possible to define the dividing line DL so that it becomes substantially parallel to the X or Y axis, namely where wafers whose diameter is less than 230 mm are to be processed by the apparatus of this embodiment, the inclined disposition of the wafer chuck WC is not required.

When the direction of division of the wafer by the dividing line DL is inclined such as in the FIG. 4A example, each of the halves (first and second regions) of the wafer surface generally extends in a direction substantially parallel to the diagonal direction (a—a) with respect to the movable range of the X-Y stage. Therefore, larger-diameter wafers can be processed, as compared with a case without using the concept of this embodiment of the present invention.

Figure 4C:
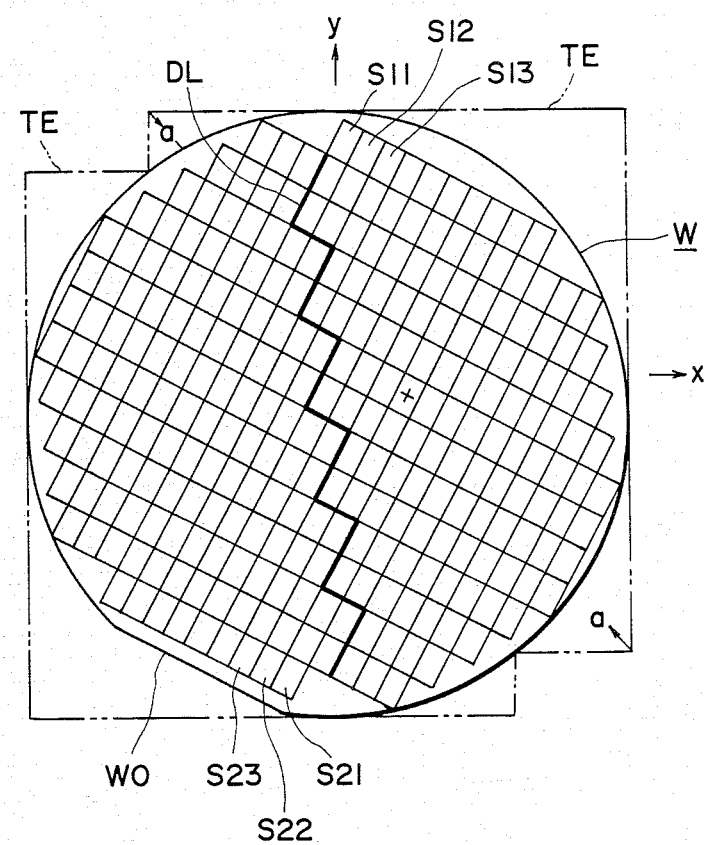
FIG. 4C is a schematic view showing an example of orientation of the wafer placed on the wafer chuck of FIG. 2A.

It is a possible alternative that the wafer chuck WC is disposed with its lengthwise direction being substantially parallel to or perpendicular to the X axis and, on the other hand, the wafer W is placed so that the arrays of the chips thereof are inclined relative to the X axis, such as shown in FIG. 4C. If the arrays of the chips of the wafer W are inclined relative to the directions of the X and Y axes, such as in this example, the step-feeding of the wafer W to bring the wafer from a position for exposure of a current shot to a position for exposure of the subseqent shot, can be achieved by simultaneously driving the stage WX and the stage WY of the X-Y stage. Usually, the step-and-repeat operation is executed while stepwisely moving the wafer in the X direction by means of the stage such as at WX of the X-Y stage. Where the arrays of the chips of the wafer are inclined as in this example, such major stepwise movement of the wafer can be made at a speed that results from the combination of the speeds of the stages WX and WY. Therefore, the step-feeding of the wafer can be made rapidly, as compared with that made by means of the stage WX only. This is desirable in respect to the throughput. If, for example, the moving speed of the stage WX and the moving speed of the stage WY are in the ratio of 4(v):5(v), the maximum speed is attainable by inclining, relative to the X axis, the arrays of the chips of the wafer by an angle $\theta = \tan^{-1}(\frac{4}{5})$, i.e. the max. speed is 5(v) is attainable.

In the embodiment described above, the wafer W is lifted up and lowered down along the Z axis at the time of shift of the position of the wafer relative to the chuck, such that the wafer W is shifted relative to the chuck WC by an amount corresponding to the amount of movement of the X-Y stage during the upward/downward movement of the wafer W. It is however a possible alternative that, in place of moving the X-Y stage, the wafer may be moved by suitable means.

Also, the recesses LR and LL of the chuck WC, provided to receive the hand HB at the time of collection of the wafer, may be omitted if the hand HC picks up the wafer from the X-Y stage and then rotates in the $\theta$ direction by 90 degrees to transfer the wafer to the hand HB. The omission of the recesses LR and LL is preferable in respect to stability in the holding of the wafer.

In the embodiment described above, wafers are introduced to and collected from the X-Y stage while the chuck WC is continuously carried by the X-Y stage. In place of this, however, each wafer may be introduced to and collected from the X-Y stage together with the chuck. That is, each wafer being held by one chuck as well as such chuck holding the wafer may be introduced to and collected from the X-Y stage, as a unit. Preferably, in such case, two or more chucks are prepared so that one or more chucks are in the wafer transporting path when a different one chuck is on the X-Y stage. By doing so, exchange of wafers (exposed one and unexposed one) by means of the common hand HA is easily attainable.

FIGS. 5A–5H show such example. More particularly, these Figures illustrate sequential operations such as wafer introduction (exchange), exposure of the first region (first half), shift of wafer position, exposure of the second region (second half) and collection (exchange), the wafer being introduced to and collected from the X-Y stage as a unit with the wafer chuck WC. During these sequential operations, the wafer W1 (or W2) is continuously held as a unit with a corresponding wafer chuck WC1 (or WC2). Except for this, the wafer handling operation is substantially the same as that having been described with reference to FIGS. 3A–3H. Therefore, detailed description of self-explanatory views of FIGS. 5A–5H is omitted, only for the sake of simplicity.

Where each wafer is handled while being held as a unit with a chuck, the possibility of damaging the wafer is significantly reduced. Also, if plural chucks having the same dimensions are prepared, there is no necessity of exchanging or resetting the hands HC and HA, which will be described with reference to FIG. 7, to meet the variation in size of the wafers.

Figure 6:
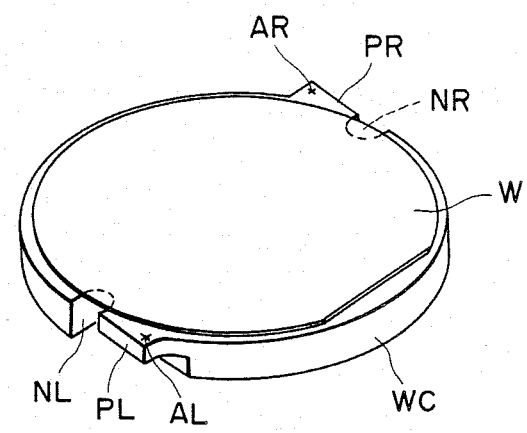
FIG. 6 is a perspective view of a wafer chuch usable to execute the wafer processing operation illustrated in FIGS. 5A-5H.

FIG. 6 shows an example of wafer chuck suitably usable for the wafer handling operations illustrated in FIGS. 5A–5H. In the example of FIG. 6, the wafer chuck denoted at WC has a generally disk-like shape whose diameter is slightly larger than the diameter of a wafer W to be handled. The wafer chuck WC is provided with notches NR and NL adapted to receive fingers of a wafer handling mechanism, not shown, when the wafer W is supplied to the wafer chuck WC or stored into a wafer carrier (not shown in this Figure). Also, the wafer chuck WC has protrusions PR and PL which protrude radially outwardly, such as shown in FIG. 6, so that they are not covered by the wafer W when it is placed on the wafer chuck. Alignment marks AR and AL of suitable configuration are formed on these protrusions PR and PL, respectively. These alignment marks AR and AL are used, together with alignment marks formed on the wafer W, so as to detect the positional relation between the wafer W and the wafer chuck WC. Preferably, such positional relation is detected during the transportation of the wafer W held as a unit with the chuck WC, i.e. in the course of the path of transportation by the wafer conveying system, not shown in this Figure. By doing so, the position of the wafer when it is introduced to the X-Y stage is easily detected by detecting the chuck alignment marks AR and AL. As a result, high-speed and high-accuracy alignment of the wafer W is attainable.

These alignment marks of the chuck WC may be used in the following manner:

That is, prior to the shift of the chuck WC position and thus the wafer W position relative to the X-Y stage, the positional relation of the alignment marks AR and AL of the chuck WC with reference marks (not shown) formed on the body of the apparatus or on the reticle RT is detected by use of the alignment system AS in FIG. 9. At this time, the position of the X-Y stage is measured by use of the laser interferometer system having the square (MX, MY). The results of detection and measurement are stored into suitable memory means. Then, after the shift of the chuck WC position relative to the X-Y stage, similar detection and measurement are effected again using the alignment marks AR and AL, the reference marks and the laser interferometer system. By this, any positional error of the wafer chuck WC which may be caused by inaccurate position shifting operation can be detected by calculation. The rotational component of the thus detected positional error can be corrected by the $\theta$-stage, while the X-Y component can be corrected by changing the amounts of movements of the stages WX and WY by corresponding amounts (i.e. the X-Y component is treated as being an offset in respect to the position of the X-Y stage). By doing so, the wafer W, more particularly the first shot area in the second half thereof, can be accurately positioned with respect to the projection lens system, with the result that the throughput can be improved.

Figure 7:
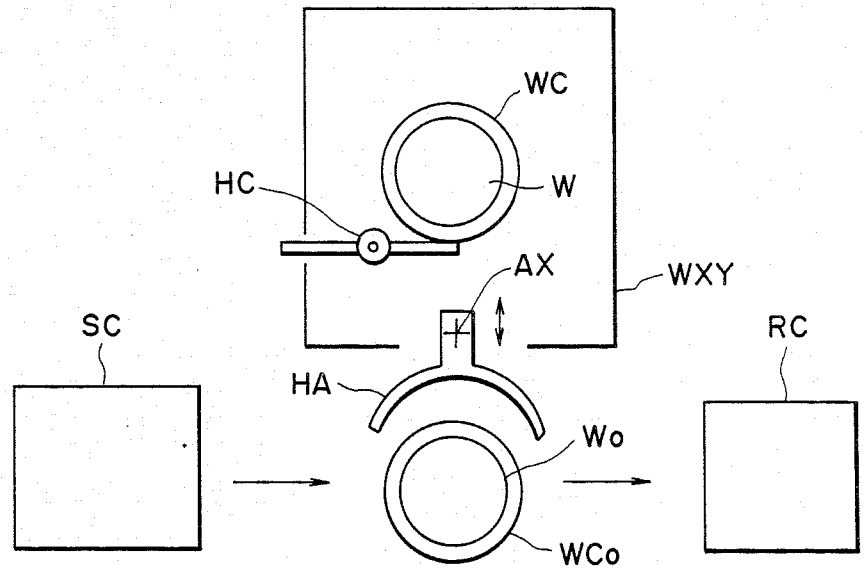
FIG. 7 is a plan view schematically showing a general arrangement of a semiconductor device manufacturing exposure apparatus according to a further embodiment of the present invention.

FIG. 7 shows an embodiment of the present invention, which is adapted to handle a wafer as a unit with a wafer chuck. Denoted by reference character HA is a hand for exchanging wafer chucks WC and WCo; and by HC a hand for moving upwardly/downwardly the wafer chuck positioned on a stage WXY. The wafer handling operation of the present embodiment is essentially the same as illustrated in FIGS. 5A–5H. A hand HA is arranged to hold the side surface of the wafer chuck and to rotate about an axis AX, thereby to exchange the wafer chucks and thus the wafers.

In the wafer transportation system, an unexposed wafer Wo is supplied from a wafer supply carrier SC and is prealigned at a prealignment station, not shown. Thereafter, it is placed on a wafer chuck WCo. Subsequently, the wafer chuck WCo now carrying thereon the wafer Wo is transferred to the hand HA. On the other hand, a wafer chuck carrying thereon an exposed wafer and having been transferred from the hand HA, is transported to a predetermined wafer collecting station, not shown, whereat the wafer is separated from the wafer chuck and stored into a wafer collecting carrier RC.

Figure 8:
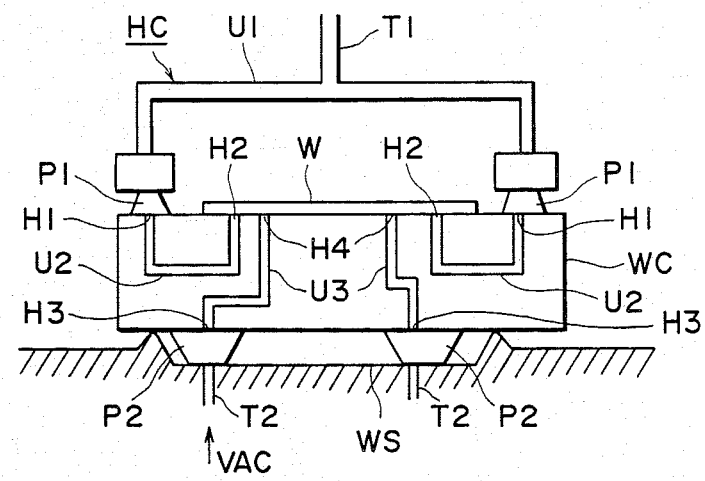
FIG. 8 is a sectional view schematically showing structure of a wafer chuck, a wafer shifting hand and an X-Y stage, suitably usable with the apparatus of FIG. 7.

FIG. 8 is a schematic view showing the structures of the hand HC, the chuck WC and the stage WS, suitably arranged to handle wafers in the manner shown in FIG. 7. When the wafer W and the chuck WC are to be transferred to the hand HC, holes H1 formed in the surface of the wafer chuck WC are covered by rubber cups P1 which are provided on the hand HC. To these rubber cups P1, vacuums are supplied by way of a tube T1. By this, pressures in a passage U1 formed in the hand HC, the rubber cups P1, passages U2 formed in the chuck WC and suction holes H2 formed in the chuck WC are reduced and, whereby, the wafer W is attracted to the chuck WC by vacuum suction from the holes H2 while the chuck WC itself is held by the hand HC by vacuum suction from the rubber cups P1. The attracting force of the chuck WC to the wafer W may be of a degree necessary for preventing any slip of the wafer W relative to the chuck WC. Accordingly, in this embodiment, a small number of holds such as H2 are formed along the periphery of the wafer W.

When, on the other hand, the wafer W and the chuck WC are to be transferred to the stage WS, holes H3 formed in the lower surface of the chuck WC are covered by rubber cups P2 which are provided on the stage WS. Thereafter, vacuums are supplied to the cups P2 by way of tubes T2 formed in the stage WS. By this, pressures in the rubber cups P2, passages U3 formed in the chuck WC and holes formed in the upper surface of the chuck WC are reduced and, whereby, the wafer W is attracted to the chuck WC by vacuum suction from the holes H4 while the chuck WC itself is attracted to the stage WS by vacuum suction from the rubber cups P2. The attracting force of the chuck WC to the wafer W is preferably of a degree that makes the wafer W satisfactorily flat. Accordingly, in this embodiment, a large number of holes such as at H4 are distributedly provided so as to be opposed to the entire region of the lower surface of the wafer W. If desired, holes may be formed in the side surface of the chuck WC which holes are in communication with another vacuum source, so that the chuck WC is held by the hand HA by the attracting force produced at the side surface thereof.

While the invention has been described with reference to the structures disclosed herein, it is not confined to the details set forth and this application is intended to cover such modifications or changes as many come within the the scope of the following claims.

What is claimed is:

1. A method of exposing in a step-and-repeat manner a plate-like workpiece to a pattern of an original, wherein the workpiece is placed on an X-Y stage movable in orthogonal X and Y directions and is moved stepwise in the X and Y directions so that different areas of the workpiece are exposed in sequence to the pattern of the original, said method comprising the steps of:
    effecting sequential exposures in the step-and-repeat manner relative to such areas on the workpiece that are included in a first portion of the surface of the workpiece;
    separating the workpiece from the X-Y stage and replacing the workpiece on the X-Y stage in a position shifted relative to the X-Y stage in at least one of the X and Y directions; and
    effecting sequential exposures after the workpiece has been shifted to such areas on the workpiece that are included in a second portion of the surface of the workpiece.

2. A method according to claim 1, wherein in said separating step, the workpiece is lifted upwardly from the X-Y stage and wherein the X-Y stage is subsequently displaced in at least one of the X and Y directions relative to the workpiece, the workpiece being replaced on the displaced X-Y stage.

3. A method according to claim 1, wherein the X-Y stage includes a chuck for holding the workpiece and wherein in said separating step the workpiece is displaced together with the chuck.

4. A step-and-repeat exposure apparatus for exposing, in sequence, different areas on a workpiece to a pattern of an original, said apparatus comprising:
    exposing means for exposing an area of the workpiece to the pattern of the original;
    an X-Y stage for holding the workpiece, said X-Y stage being movable stepwise in orthogonal X and Y directions to permit step-and-repeat exposure of the workpiece by said exposing means;
    workpiece shifting means for separating the workpiece from said X-Y stage and for replacing the workpiece on said X-Y stage so that the workpiece and said X-Y stage are relatively shifted in at least one of the X and Y directions; and
    control means for causing said workpiece shifting means to shift the workpiece relative to said X-Y stage after such areas on the workpiece that are included in a first portion of the workpiece are exposed in sequence to the pattern of the original, so that exposure of such areas on workpiece that are included in a second portion of the workpiece are effected thereafter and in sequence.

5. An apparatus according to claim 4, wherein said X-Y stage includes a chuck for holding the workpiece, and wherein said chuck is adapted to hold the workpiece so that an array of the areas on the workpiece is inclined relative to the X and Y directions.

6. An apparatus according to claim 5, wherein said chuck is adapted to hold only that portion of the workpiece which substantially corresponds to said first or second portion of the workpiece and which is about to be exposed in the step-and-repeat manner.

7. An apparatus according to claim 6, wherein said chuck includes a groove for applying vacuum suction to the workpiece and includes a passage for supplying a vacuum to said groove.

8. An apparatus according to claim 4, wherein said X-Y stage has a movable range which is smaller than the size of the workpiece.

9. An apparatus according to claim 4, wherein said shifting means is arranged to lift the workpiece upwardly from said X-Y stage and wherein said X-Y stage is subsequently displaced in at least one of the X and Y directions relative to the workpiece, the workpiece being replaced on said displaced X-Y stage.

10. An apparatus according to claim 4, wherein said X-Y stage includes a chuck for holding the workpiece and wherein said workpiece shifting means is arranged to separate the workpiece together with said chuck from said X-Y stage.

11. An apparatus for processing a workpiece, said apparatus comprising:
 transporting means for transporting processed and unprocessed workpieces;
 a stage for carrying the workpiece;
 means for effecting a predetermined operation to process the workpiece carried on said stage;
 a first mechanical hand for removing the processed workpiece from said stage; and
 a second mechanical hand for receiving the unprocessed workpiece from said transporting means and for placing the unprocessed workpiece on said stage, said second mechanical hand being also arranged to receive the processed workpiece from said first mechanical hand and to transfer the processed workpiece to said transporting means.

12. An apparatus according to claim 11, wherein said first mechanical hand is rotatable about an axis which is eccentric with respect to a center of the workpiece when it is held by said first mechanical hand, and wherein said first mechanical hand holds the processed workpiece and then rotates about said axis so as to allow transfer of the workpiece to said second mechanical hand.

13. An apparatus according to claim 12 further comprising a third hand movable in a direction different from a moving direction of said second mechanical hand to collect the processed workpiece, and wherein said first mechanical hand holds the processed workpiece and rotates so as to allow transfer of the processed workpiece to said third hand.

14. A method of exposing a step-and-repeat manner a plate-like workpiece to a pattern of an original, wherein the workpiece is placed on a rotatable table disposed on an X-Y stage movable in orthogonal X and Y directions and wherein the workpiece is moved stepwise in the X and Y directions so that different areas on the workpiece are exposed in sequence to the pattern of the original, said method comprising the steps of:
 effecting sequential exposures in the step-and-repeat manner relative to such areas on the workpiece that are included in a first portion of the surface of the workpiece;
 shifting the workpiece relative to the rotatable table in at least one of the X and Y directions; and
 effecting sequential exposures after said shifting step relative to such areas on the workpiece that are included in a second portion of the surface of the workpiece.

15. A method according to claim 14, wherein in said shifting step the workpiece is lifted upwardly from the rotatable table and wherein the X-Y stage carrying the rotatable table is subsequently displaced in at least one of the X and Y directions relative to the workpiece, the workpiece being replaced on the rotatable table carried on the displaced X-Y stage.

16. A method according to claim 14, wherein the X-Y stage includes a chuck disposed on the rotatable table for holding the workpiece and wherein in said shifting step the workpiece is displaced together with the chuck.

17. A step-and-repeat exposure apparatus for exposing, in sequence, different areas on a workpiece to a pattern of an original, said apparatus comprising:
 exposing means for exposing an area of the workpiece to the pattern of the original;
 an X-Y stage having a rotatable table for holding the workpiece, said X-Y stage being movable stepwise in orthogonal X and Y directions to permit step-and-repeat exposure of the workpiece by said exposing means;
 workpiece shifting means for shifting the workpiece relative to said rotatable table in at least one of the X and Y directions; and
 control means for causing said shifting means to shift the workpiece relative to said rotatable table after such areas on the workpiece that are included in a first portion of the surface of the workpiece are exposed in sequence to the pattern of the original, so that exposure of such areas on the workpiece that are included in a second portion of the surface of the workpiece are effected thereafter and in sequence.

18. An apparatus according to claim 17, wherein said X-Y stage has a movable range which is smaller than the size of the workpiece.

19. An apparatus according to claim 17, wherein said X-Y stage includes a chuck disposed on said rotatable table for holding the workpiece, and wherein said chuck is adapted to hold the workpiece so that an aray of the areas on the workpiece is inclined relative to the X and Y directions.

20. An apparatus according to claim 19, wherein said chuck is adapted to hold only that portion of the workpiece which substantially corresponds to said first or second portion of the workpiece and which is about to be exposed in the step and-repeat manner.

21. An apparatus according to claim 20, wherein said chuck includes a groove for applying vacuum suction to the workpiece and includes a passage for supplying a vacuum to said groove.

22. An apparatus according to claim 17, wherein said shifting means is arranged to lift the workpiece upwardly from said rotatable table and wherein said X-Y stage carrying said rotatable table is subsequently displaced in at least one of the X and Y directions relative to the workpiece, the workpiece being replaced on said rotatable table carried on said displaced X-Y stage.

23. An apparatus according to claim 17, wherein said X-Y stage includes a chuck disposed on said rotatable table for holding the workpiece and wherein said workpiece shifting means is arranged to shift the workpiece together with said chuck relative to said rotatable table.

* * * * *

UNITED STATES PATENT AND TRADEMARK OFFICE
CERTIFICATE OF CORRECTION

PATENT NO.   : 4,775,877
DATED        : October 4, 1988
INVENTOR(S)  : MASAO KOSUGI, ET AL.

It is certified that error appears in the above-identified patent and that said Letters Patent is hereby corrected as shown below:

COLUMN 1

Line 35, "($\phi$=200" should read --($\phi$=200mm)--.
   Line 36, "are" should be deleted.
   Line 65, "is" should read --are--.

COLUMN 3

Line 15, "by new" should read --by a new--.

COLUMN 4

Line 1, "chuch" should read --chuck--.
   Line 19, ""stepper"," should read --"stepper"),--.

COLUMN 5

Line 10, "the WX" should read --the stage WX--.

COLUMN 7

Line 5, "stepwisely" should read --stepwise--.
   Line 33, "stepwisely" should read --stepwise--.

COLUMN 8

Line 27, "XY stage." should read --X-Y stage.--.

COLUMN 9

Line 3, "stepwisely" should read --stepwise--.

UNITED STATES PATENT AND TRADEMARK OFFICE
CERTIFICATE OF CORRECTION

PATENT NO. : 4,775,877            Page 2 of 2
DATED : October 4, 1988
INVENTOR(S) : MASAO KOSUGI, ET AL.

It is certified that error appears in the above-identified patent and that said Letters Patent is hereby corrected as shown below:

COLUMN 11

Line 61, "many" should read --may--.

COLUMN 12

Line 44, "on workpiece" should read --on the workpiece--.

COLUMN 13

Line 32, "claim 12" should read --claim 12,--.
    Line 39, "exposing a" should read --exposing in a--.

COLUMN 14

Line 36, "aray" should read --array--.
    Line 43, "step and-repeat" should read --step-and-repeat--.

Signed and Sealed this

Eighteenth Day of April, 1989

*Attest:*

DONALD J. QUIGG

*Attesting Officer*      *Commissioner of Patents and Trademarks*